United States Patent
Hayahi et al.

(10) Patent No.: US 7,273,665 B2
(45) Date of Patent: Sep. 25, 2007

(54) SURFACE-COATED CERMET CUTTING TOOL WITH HARD COATING LAYER HAVING EXCELLENT CHIPPING RESISTANCE

(75) Inventors: Takuya Hayahi, Naka-gun (JP); Fumio Tsushima, Naka-gun (JP); Takatoshi Oshika, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 217 days.

(21) Appl. No.: 11/019,656

(22) Filed: Dec. 21, 2004

(65) Prior Publication Data

US 2005/0164042 A1 Jul. 28, 2005

(30) Foreign Application Priority Data

| Dec. 22, 2003 | (JP) | ............................ 2003-424401 |
| Dec. 22, 2003 | (JP) | ............................ 2003-424402 |
| Feb. 18, 2004 | (JP) | ............................ 2004-040764 |
| Mar. 3, 2004 | (JP) | ............................ 2004-058682 |
| Mar. 3, 2004 | (JP) | ............................ 2004-058683 |

(51) Int. Cl.
B23P 15/28 (2006.01)
B23B 27/14 (2006.01)

(52) U.S. Cl. .......................... 428/699; 51/307; 51/309; 428/216; 428/336; 428/697; 428/698; 428/701; 428/702

(58) Field of Classification Search ................ 428/212, 428/216, 336, 697, 698, 699, 701, 702; 51/309, 51/307
See application file for complete search history.

(56) References Cited

U.S. PATENT DOCUMENTS

| 4,180,400 A | | 12/1979 | Smith et al. | |
| 4,540,596 A | * | 9/1985 | Nimmagadda | 427/249.17 |
| 4,701,384 A | * | 10/1987 | Sarin et al. | 428/701 |
| 5,310,607 A | * | 5/1994 | Schulz et al. | 428/701 |
| 6,426,137 B1 | | 7/2002 | Oshika et al. | |
| 6,586,122 B2 | * | 7/2003 | Ishikawa et al. | 428/699 |
| 6,660,371 B1 | * | 12/2003 | Westphal et al. | 428/697 |
| 6,726,987 B2 | * | 4/2004 | Kathrein et al. | 428/336 |
| 6,733,874 B2 | | 5/2004 | Ueda et al. | |
| 6,767,627 B2 | * | 7/2004 | Morikawa et al. | 428/701 |
| 6,835,446 B2 | | 12/2004 | Ueda et al. | |
| 6,855,405 B2 | * | 2/2005 | Okada et al. | 428/216 |
| 2004/0224159 A1 | | 11/2004 | Oshika et al. | |

FOREIGN PATENT DOCUMENTS

| EP | 1 247 789 | * 10/2002 |
| JP | 06-008010 | 1/1994 |
| JP | 06-031503 | 2/1994 |

OTHER PUBLICATIONS

Kathrein et al "Doped CVD Al2O3 coatings for high performance cutting tools" Surface & Coating Technology, vol. 163, Jan. 1, 2003, pp. 181-188.*
Patent Abstract of EP027510 published Aug. 21, 1996.
Patent Abstract of EP0403461 published Dec. 12, 1990.
Patent Abstracts of Japan for JP06-031503 published on Feb. 8, 1994.
Patent Abstracts of Japan for JP06-008010 published on Jan. 18, 1994.

* cited by examiner

Primary Examiner—Archene Turner
(74) Attorney, Agent, or Firm—Darby & Darby

(57) ABSTRACT

There is provided a surface-coated cermet cutting tool with a hard-coating layer having excellent chipping resistance. The surface-coated cermet cutting tool is formed by coating, on a surface of a tool substrate made of WC-based cemented carbide or TiCN-based cermet, a hard-coating layer including the following upper and lower layers (a) and (b): (a) as the lower layer, a Ti compound layer having at least one or two of a TiC layer, a TiN layer, a TiCN layer, a TiCO layer and a TiCNO layer, all of which are deposited by chemical vapor deposition, the titanium compound layer having a total average thickness of 3 to 20 μm, and (b) as the upper layer, a heat-transformed α-type Al oxide layer formed by carrying out a heat-transforming treatment in a state that titanium oxide particulates satisfying the composition formula: $TiO_Y$, (where value Y is 1.2 to 1.9 in an atomic ratio to Ti when measured by Auger Electron Spectroscopy) and chemically deposited as a transformation starting material are dispersedly distributed on a surface of an Al oxide layer having a κ-type or θ-type crystal structure deposited by chemical vapor deposition and satisfying the composition formula: $(Al_{1-X}Zr_X)_2O_3$ (where value X is 0.003 to 0.05 in an atomic ratio when measured by an electron probe microanalyzer (EPMA)) to thereby transform the crystal structure of the Al oxide layer having the κ-type or θ-type crystal structure into an α-type crystal structure, the heat-transformed α-type Al oxide layer having an average thickness of 1 to 15 μm.

3 Claims, No Drawings

SURFACE-COATED CERMET CUTTING TOOL WITH HARD COATING LAYER HAVING EXCELLENT CHIPPING RESISTANCE

INCORPORATION BY REFERENCE

The present application claims priority under 35 U.S.C. §119 to Japanese Patent Application Nos. 2003-424401 filed Dec. 22, 2003; 2003-424402 filed Dec. 22, 2003; 2004-040764 filed Feb. 18, 2004; 2004-058682 filed Mar. 3, 2004; 2004-058683 filed Mar. 3, 2004 and 2004-058686 filed Mar. 3, 2004. The content of the applications are incorporated herein by reference in their entireties.

BACKGROUND OF THE INVENTION

1. Field of the Invention

The present invention relates to a surface-coated cermet cutting tool (hereinafter, referred to as a coated cermet tool) of which a hard coating layer exhibits excellent chipping resistance, in particular, during high-speed intermittent cutting of steel, cast iron, etc.

2. Description of the Related Art

Conventionally, a coated cermet tool is known, which is generally formed by coating, on a surface of a substrate (hereinafter, generally referred to as a tool substrate) made of tungsten carbide (hereinafter, referred to as WC)-based cemented carbide or titanium carbonitride (hereinafter, referred to as TiCN)-based cermet, a hard-coating layer including the following upper and lower layers (a) and (b):

(a) as the lower layer, a titanium compound layer having at least one or two of titanium carbide (hereinafter, referred to as TiC) layer, a titanium nitride (hereinafter, referred to as TiN) layer, a titanium carbonitride (hereinafter, referred to as TiCN) layer, a titanium carboxide (hereinafter, referred to as TiCO) layer, and a titanium oxycarbonitride (hereinafter, referred to as TiCNO) layer, all of which are formed by chemical vapor deposition, the titanium compound layer having a total average thickness of 3 to 20 μm, and (b) as the upper layer, a deposited α-type aluminum oxide (hereinafter, referred to as $Al_2O_3$) layer having an α-type crystal structure deposited by chemical vapor deposition and an average thickness of 1 to 15 μm. It is also known that the coated cermet tool is widely used for, for example, continuous or intermittent cutting of steel or cast iron.

Generally, it is also well known that a titanium compound layer or the $Al_2O_3$ layer constituting the hard-coating layer of a coated cermet tool has a granular crystal structure, and further the TiCN layer constituting the titanium compound layer has a longitudinal growth crystal structure formed by carrying out chemical vapor deposition in a moderate temperature range of 700 to 950° C. using as a reaction gas a mixed gas which includes organic carbonitride, for example, $CH_3CN$ in a conventional chemical vapor deposition reactor for the purpose of increasing the strength of the layer.

[Patent Document 1] Japanese Unexamined Patent Application Publications No. 6-31503

[Patent Document 2] Japanese Unexamined Patent Application Publications No. 6-8010.

In recent years, the performance of cutting tools has been markedly enhanced, and demands for labor saving and energy saving in cutting work and cost reduction have been increased. Accordingly, the cutting work is more often carried out at a higher speed range. The conventional coated cermet tools generally present no problem when they are used in the continuous cutting or intermittent cutting of steel, cast iron or the like under normal conditions. However, when the conventional cutting tools are used in a high-speed intermittent cutting under the severest cutting condition, i.e., in the high-speed intermittent cutting where mechanical and thermal impacts are repeatedly applied to the cutting edge at very short pitches, a titanium compound layer which is typically the lower layer of a hard-coating layer has high strength and exhibits excellent impact resistance. However, the deposited α-type $Al_2O_3$ layer that constitutes the upper layer of a hard-coating layer, despite its hardness in high temperature and excellent heat resistance, is very brittle against the mechanical and thermal impacts. As a result, chipping easily occurs in the hard coating layer, consequently shortening the usable life of cermet cutting tools.

SUMMARY OF THE INVENTION

Considering the above problems, the inventors have conducted studies for improving the chipping resistance of a deposited α-type $Al_2O_3$ layer that constitutes the upper layer of the hard coating layer of the coated cermet tools, and have obtained the following results.

On a surface of a tool substrate, the Ti compound layer as a lower layer is formed under normal conditions using a conventional chemical vapor deposition reactor. An Al oxide layer (hereinafter, referred to as an $(Al, Zr)_2O_3$ layer) having a κ-type or θ-type crystal structure and satisfying the composition formula: $(Al_{1-X}Zr_X)_2O_3$ (where value X is 0.003 to 0.05 in an atomic ratio when measured by an electron probe micro-analyzer (EPMA)) is deposited under the same normal conditions. Next, the surface of the $(Al, Zr)_2O_3$ layer is processed using the chemical vapor deposition reactor under the following conditions:

Composition of reaction gas: in volume %, $TiCl_4$: 0.2 to 3%, $CO_2$: 0.2 to 10%, Ar: 5 to 50%, and $H_2$: balance, Temperature of reaction atmosphere: 900 to 1020° C., Pressure of reaction atmosphere: 7 to 30 kPa, and Time: 1 to 10 min.

Then, titanium oxide particulates satisfying the composition formula: $TiO_Y$, (where value Y is 1.2 to 1.9 in an atomic ratio to Ti when measured by Auger Electron Spectroscopy) are dispersedly distributed on the surface of the $(Al, Zr)_2O_3$ layer. In this state, by carrying out a heat-transforming treatment in an atmosphere of Ar gas, preferably, under the following conditions: a pressure of 7 to 50 kPa, a temperature of 1000 to 1200° C., and a holding duration of 10 to 120 minutes, the $(Al, Zr)_2O_3$ layer having the κ-type or θ-type crystal structure is transformed into the $(Al, Zr)_2O_3$ layer having an α-type crystal structure. Then, since the titanium oxide particulates uniformly distributed on the surface of the $(Al, Zr)_2O_3$ layer before the transformation serve as starting points of cracks generated at the time of the transformation of the κ-type or θ-type crystal structure into the a-type crystal structure in the heat-transformed α-type $(Al, Zr)_2O_3$ layer, the cracks generated at the time of the transformation become extremely fine and the titanium oxide particulates are uniformly and dispersedly distributed. Further, since the strength of the (Al, Zr)$_2$O$_3$ layer itself is markedly enhanced by action of Zr as a constituent element thereof, the heat-transformed α-type (Al, Zr)$_2$O$_3$ layer has a uniformed structure in which the cracks generated by the transformation process become fine over the entire layer, in addition to high strength, high strength, thereby having very strong resistance against mechanical and thermal impacts and excellent chipping resistance. Accordingly, in the coated cermet tool having a hard-coating layer including the heat-transformed α-type (Al, Zr)$_2$O$_3$ layer as the upper layer and the titanium compound layer (this titanium compound layer does not exhibit any change during the heat-transforming treatment under the above-mentioned conditions) as the lower layer, the heat-transformed α-type (Al, Zr)$_2$O$_3$ layer exhibits excellent chipping resistance, even in a high-speed intermittent cutting accompanied with severe mechanical and thermal impacts, with the same high temperature hardness and heat resistance as the excellent high temperature hardness and heat resistance inherent to an α-type Al$_2$O$_3$ layer. As a result, with the presence of the titanium compound layer having high strength, the occurrence of chipping in the hard coating layer is markedly suppressed and an excellent wear resistance is exhibited for a prolonged period of time.

An implementation of the present invention is contrived based on the results of studies described above, and there is thus provided a surface-coated cermet cutting tool formed by coating, on a surface of a tool substrate made of WC-based cemented carbide or TiCN-based cermet, a hard-coating layer including the following upper and lower layers (a) and (b):

(a) as the lower layer, a Ti compound layer having at least one or two of a TiC layer, a TiN layer, a TiCN layer, a TiCO layer and a TiCNO layer, all of which are deposited by chemical vapor deposition, the titanium compound layer having a total average thickness of 3 to 20 μm, and (b) as the upper layer, a heat-transformed α-type (Al, Zr)$_2$O$_3$ layer formed by carrying out a heat-transforming treatment in a state that titanium oxide particulates satisfying the composition formula: TiO$_Y$, (where value Y is 1.2 to 1.9 in an atomic ratio to Ti when measured by Auger Electron Spectroscopy) and chemically deposited as a transformation starting material are dispersedly distributed on a surface of an (Al, Zr)$_2$O$_3$ layer having a κ-type or θ-type crystal structure deposited by chemical vapor deposition and satisfying the composition formula: (Al$_{1-X}$Zr$_X$)$_2$O$_3$ (where value X is 0.003 to 0.05 in an atomic ratio when measured by an electron probe micro-analyzer (EPMA)) to thereby transform the crystal structure of the (Al, Zr)$_2$O$_3$ layer having the κ-type or θ-type crystal structure into an α-type crystal structure, the heat-transformed α-type (Al, Zr)$_2$O$_3$ layer having an average thickness of 1 to 15 μm.

Next, the reasons for limiting the numerical values in the layers constituting the hard coating layer of the coated cermet layer of an implementation of the present invention as described above will be described below.

(a) Average Thickness of Lower Layer (Ti Compound Layer)

The titanium compound layer inherently has high strength, and the hard-coating layer has high temperature strength by effect of the existence of the titanium compound layer. In addition, the titanium compound layer is firmly adhered to both of the tool substrate and the heat-transformed α-type (Al, Zr)$_2$O$_3$ layer that is the upper layer. Accordingly, it contributes to improving the adherence of the hard coating layer to the tool substrate. However, when the total average thickness is less than 3 μm, the above function cannot be sufficiently obtained. On the other hand, when the total average thickness is greater 20 μm, thermal plastic deformation is apt to occur, particularly in a high-speed intermittent cutting accompanied by the generation of high heat, which causes partial wear. Accordingly, the average thickness is preferably set to 3 to 20 μm.

(b) Value Y of Titanium Oxide Particulates

As described above, since the titanium oxide particulates serve as starting points of the cracks generated at the time of transformation of the deposited κ-type or θ-type (Al, Zr)$_2$O$_3$ layer into the α-type (Al, Zr)$_2$O$_3$ layer, the cracks generated at the time of the transformation in the heat-transformed α-type (Al, Zr)$_2$O$_3$ layer are made fine and are uniformly and dispersedly distributed. As a result, the heat-transformed α-type (Al, Zr)$_2$O$_3$ layer has excellent chipping resistance. However, when value Y thereof to Ti is less than 1.2 in an atomic ratio and when value Y is greater than 1.9, the effect of making the cracks generated at the time of the transformation fine cannot be sufficiently obtained. Therefore, value Y is set to 1.2 to 1.9 in an atomic ratio to Ti.

(c) Content Ratio of Zr in Upper Layer [a Heat-Transformed α-type (Al, Zr)$_2$O$_3$ Layer] and Average Thickness thereof since the heat-transformed α-type (Al, Zr)$_2$O$_3$ layer has excellent high temperature hardness and heat resistance by action of Al as a constituent element thereof, and has high strength by action of Zr as a constituent element thereof, the heat-transformed α-type (Al, Zr)$_2$O$_3$ layer exhibits excellent wear resistance and chipping resistance. However, when the content ratio (value X) of Zr is less than 0.003 in an atomic ratio (this is true of the following ratios) which is a ratio to the total content with Al, sufficient high temperature strength cannot be secured. On the other hand, when the content ratio of Zr is greater than 0.05, instability is caused in the transformation, which makes it difficult to sufficiently transform the κ-type or θ-type crystal structure into the α-type crystal structure during the heat-transforming treatment. Thus, the content ratio (value X) of Zr is preferably set to 0.003 to 0.05.

Further, when the average thickness of the heat-transformed α-type (Al, Zr)$_2$O$_3$ layer is less than 1 μm, the hard coating layer cannot have sufficient high temperature hardness and heat resistance. On the other hand, when the average thickness of the heat-transformed α-type (Al, Zr)$_2$O$_3$ layer is greater than 15 μm, chipping is apt to occur, so that the average thickness of the heat-transformed α-type (Al, Zr)$_2$O$_3$ layer is preferably set to 1 to 15 μm.

Furthermore, for the purpose of identifying the cutting tool before and after using the cutting tool, the TiN layer having a gold color tone may be deposited as needed. In this case, the average thickness of the TiN layer is preferably 0.1 to 1 μm. This is because, when the average thickness is less than 0.1 μm, sufficient identification cannot be achieved, and the identification due to the TiN layer can be sufficiently obtained only with an average thickness of up to 1 μm.

Moreover, the inventors have conducted studies for improving the chipping resistance of a deposited α-type Al$_2$O$_3$ layer that constitutes the upper layer of the hard coating layer of the conventional coated cermet tools, and have obtained the following results.

On a surface of a tool substrate, the Ti compound layer as a lower layer is formed under normal conditions using a conventional chemical vapor deposition reactor. An Al oxide layer (hereinafter, referred to as an (Al, Ti)$_2$O$_3$ layer) having a κ-type or θ-type crystal structure and satisfying the composition formula: (Al$_{1-X}$Ti$_X$)$_2$O$_3$ (where value X is 0.01 to 0.05 in an atomic ratio when measured by an electron probe micro-analyzer (EPMA)) is deposited under the same normal conditions. Next, the surface of the (Al, Ti)$_2$O$_3$ layer is processed using the chemical vapor deposition reactor under the following conditions:

Composition of reaction gas: in volume %, TiCl$_4$: 0.2 to 3%, CO$_2$: 0.2 to 10%, Ar: 5 to 50%, and H$_2$: balance, Temperature of reaction atmosphere: 900 to 1020° C., Pressure of reaction atmosphere: 7 to 30 kPa, and Time: 1 to 10 min.

Then, titanium oxide particulates satisfying the composition formula: TiO$_Y$, (where value Y is 1.2 to 1.9 in an atomic ratio to Ti when measured by Auger Electron Spectroscopy) are dispersedly distributed on the surface of the (Al, Ti)$_2$O$_3$ layer. In this state, by carrying out a heat-transforming treatment in an atmosphere of Ar gas, preferably, under the following conditions: a pressure of 7 to 50 kPa, a temperature of 1000 to 1200° C., and a holding duration of 10 to 120 minutes, the (Al, Ti)$_2$O$_3$ layer having the κ-type or θ-type crystal structure is transformed into the (Al, Ti)$_2$O$_3$ layer having an α-type crystal structure. Then, since the titanium oxide particulates uniformly distributed on the surface of the (Al, Ti)$_2$O$_3$ layer before the transformation serve as starting points of cracks generated at the time of the transformation of the κ-type or θ-type crystal structure into the α-type crystal structure in the heat-transformed α-type (Al, Ti)$_2$O$_3$ layer, the cracks generated at the time of the transformation become extremely fine and the titanium oxide particulates are uniformly and dispersedly distributed. Further, since the crystal growth at the time of the heat transformation is suppressed by action of Ti as a constituent element thereof and the fineness of the crystal is thus accomplished, excellent chipping resistance can be obtained. Accordingly, in the coated cermet tool having a hard-coating layer including the heat-transformed α-type (Al, Ti)$_2$O$_3$ layer as the upper layer and the titanium compound layer (this titanium compound layer does not exhibit any change during the heat-transforming treatment under the above-mentioned conditions) as the lower layer, the heat-transformed α-type (Al, Ti)$_2$O$_3$ layer exhibits excellent chipping resistance, even in a high-speed intermittent cutting accompanied with severe mechanical and thermal impacts, with the same high temperature hardness and heat resistance as the excellent high temperature hardness and heat resistance inherent to an α-type Al$_2$O$_3$ layer. As a result, with the presence of the titanium compound layer having high strength, the occurrence of chipping in the hard coating layer is markedly suppressed and an excellent wear resistance is exhibited for a prolonged period of time.

An implementation of the present invention is contrived based on the results of studies described above, and there is thus provided a surface-coated cermet cutting tool formed by coating, on a surface of a tool substrate made of WC-based cemented carbide or TiCN-based cermet, a hard-coating layer including the following upper and lower layers (a) and (b):

(a) as the lower layer, a Ti compound layer having at least one or two of a TiC layer, a TiN layer, a TiCN layer, a TiCO layer and a TiCNO layer, all of which are deposited by chemical vapor deposition, the titanium compound layer having a total average thickness of 3 to 20 μm, and (b) as the upper layer, a heat-transformed α-type (Al, Ti)$_2$O$_3$ layer formed by carrying out a heat-transforming treatment in a state that titanium oxide particulates satisfying the composition formula: TiO$_Y$, (where value Y is 1.2 to 1.9 in an atomic ratio to Ti when measured by Auger Electron Spectroscopy) and chemically deposited as a transformation starting material are dispersedly distributed on a surface of an (Al, Ti)$_2$O$_3$ layer having a κ-type or θ-type crystal structure deposited by chemical vapor deposition and satisfying the composition formula: (Al$_{1-X}$Ti$_X$)$_2$O$_3$ (where value X is 0.01 to 0.05 in an atomic ratio when measured by an electron probe micro-analyzer (EPMA)) to thereby transform the crystal structure of the (Al, Ti)$_2$O$_3$ layer having the κ-type or θ-type crystal structure into an α-type crystal structure, the heat-transformed α-type (Al, Ti)$_2$O$_3$ layer having an average thickness of 1 to 15 μm.

Next, the reasons for limiting the numerical values in the layers constituting the hard coating layer of the coated cermet layer of an implementation of the present invention as described above will be described below.

(a) Average Thickness of Lower Layer (Ti Compound Layer)

The titanium compound layer inherently has high strength, and the hard-coating layer has high temperature strength by effect of the existence of the titanium compound layer. In addition, the titanium compound layer is firmly adhered to both of the tool substrate and the heat-transformed α-type (Al, Ti)$_2$O$_3$ layer that is the upper layer. Accordingly, it contributes to improving the adherence of the hard coating layer to the tool substrate. However, when the total average thickness is less than 3 μm, the above function cannot be sufficiently obtained. On the other hand, when the total average thickness is greater 20 μm, thermal plastic deformation is apt to occur, particularly in a high-speed intermittent cutting accompanied by the generation of high heat, which causes partial wear. Accordingly, the average thickness is preferably set to 3 to 20 μm.

(b) Value Y of Titanium Oxide Particulates

As described above, since the titanium oxide particulates serve as starting points of the cracks generated at the time of transformation of the deposited κ-type or θ-type (Al, Ti)$_2$O$_3$ layer into the α-type (Al, Ti)$_2$O$_3$ layer, the cracks generated at the time of the transformation in the heat-transformed α-type (Al, Ti)$_2$O$_3$ layer are made fine and are uniformly and dispersedly distributed. As a result, the heat-transformed α-type (Al, Ti)$_2$O$_3$ layer has excellent chipping resistance. However, when value Y thereof to Ti is less than 1.2 in an atomic ratio and when value Y is greater than 1.9, the effect of making the cracks generated at the time of the transformation fine cannot be sufficiently obtained. Therefore, value Y is set to 1.2 to 1.9 in an atomic ratio to Ti.

(c) Content Ratio of Ti in Upper Layer [a Heat-Transformed α-type (Al, Ti)$_2$O$_3$ Layer] and Average Thickness thereof since the heat-transformed α-type (Al, Ti)$_2$O$_3$ layer has excellent high temperature hardness and heat resistance by action of Al as a constituent element thereof and the crystal growth at the time of the heat transformation is suppressed by action of Ti as a constituent element thereof to thereby make the crystal finer, excellent wear resistance and chipping resistance can be obtained together with uniform and fine distribution of the cracks generated at the time of the heat transformation. However, when the content ratio (value X) of Ti is less than 0.01 in an atomic ratio (this is true of the following ratios) which is a ratio to the total content with Al, a sufficient fine crystal structure cannot be secured. On the other hand, when the content ratio of Ti is greater than 0.05, instability is caused in the transformation, which makes it difficult to sufficiently transform the κ-type or θ-type crystal structure into the α-type crystal structure during the heat-transforming treatment. Thus, the content ratio (value X) of Ti is preferably set to 0.01 to 0.05, and more preferably to 0.015 to 0.035.

Further, when the average thickness of the heat-transformed α-type (Al, Ti)$_2$O$_3$ layer is less than 1 μm, the hard coating layer cannot have sufficient high temperature hardness and heat resistance. On the other hand, when the average thickness of the heat-transformed α-type (Al, Ti)$_2$O$_3$ layer is greater than 15 μm, chipping is apt to occur, so that the average thickness of the heat-transformed α-type (Al, Ti)$_2$O$_3$ layer is preferably set to 1 to 15 μm.

Furthermore, for the purpose of identifying the cutting tool before and after using the cutting tool, the TiN layer having a gold color tone may be deposited as needed. In this case, the average thickness of the TiN layer is preferably 0.1 to 1 μm. This is because, when the average thickness is less than 0.1 μm, sufficient identification cannot be achieved, and the identification due to the TiN layer can be sufficiently obtained only with an average thickness of up to 1 μm.

Moreover, the inventors have conducted studies for improving the chipping resistance of a deposited α-type Al$_2$O$_3$ layer that constitutes the upper layer of the hard coating layer of the conventional coated cermet tools, and have obtained the following results.

On a surface of a tool substrate, the Ti compound layer as a lower layer is formed under normal conditions using a conventional chemical vapor deposition reactor. An Al oxide layer (hereinafter, referred to as an (Al, Cr)$_2$O$_3$ layer) having a κ-type or θ-type crystal structure and satisfying the composition formula: (Al$_{1-X}$Cr$_X$)$_2$O$_3$ (where value X is 0.005 to 0.04 in an atomic ratio when measured by an electron probe micro-analyzer (EPMA)) is deposited under the same normal conditions. Next, the surface of the (Al, Cr)$_2$O$_3$ layer is processed using the chemical vapor deposition reactor under the following conditions:

Composition of reaction gas: in volume %, TiCl$_4$: 0.2 to 3%, CO$_2$: 0.2 to 10%, Ar: 5 to 50%, and H$_2$: balance,
Temperature of reaction atmosphere: 900 to 1020° C.,
Pressure of reaction atmosphere: 7 to 30 kPa, and
Time: 1 to 10 min.

Then, titanium oxide particulates satisfying the composition formula: TiO$_Y$, (where value Y is 1.2 to 1.9 in an atomic ratio to Ti when measured by Auger Electron Spectroscopy) are dispersedly distributed on the surface of the (Al, Cr)$_2$O$_3$ layer. In this state, by carrying out a heat-transforming treatment in an atmosphere of Ar gas, preferably under the following conditions: a pressure of 7 to 50 kPa, a temperature of 1000 to 1200° C., and a holding duration of 10 to 120 minutes, the (Al, Cr)$_2$O$_3$ layer having the κ-type or θ-type crystal structure is transformed into the (Al, Cr)$_2$O$_3$ layer having an α-type crystal structure. Then, since the titanium oxide particulates uniformly distributed on the surface of the (Al, Cr)$_2$O$_3$ layer before the transformation serve as starting points of cracks generated at the time of the transformation of the κ-type or θ-type crystal structure into the α-type crystal structure in the heat-transformed α-type (Al, Cr)$_2$O$_3$ layer, the cracks generated at the time of the transformation become extremely fine and the titanium oxide particulates are uniformly and dispersedly distributed. Further, since fineness of the cracks generated at the time of the transformation is further promoted by action of Cr as a constituent element thereof, excellent chipping resistance can be obtained. Accordingly, in the coated cermet tool having a hard-coating layer including the heat-transformed α-type (Al, Cr)$_2$O$_3$ layer as the upper layer and the titanium compound layer (this titanium compound layer does not exhibit any change during the heat-transforming treatment under the above-mentioned conditions) as the lower layer, the heat-transformed α-type (Al, Cr)$_2$O$_3$ layer exhibits excellent chipping resistance, even in a high-speed intermittent cutting accompanied with severe mechanical and thermal impacts, with the same high temperature hardness and heat resistance as the excellent high temperature hardness and heat resistance inherent to an α-type Al$_2$O$_3$ layer. As a result, with the presence of the titanium compound layer having high strength, the occurrence of chipping in the hard coating layer is markedly suppressed and an excellent wear resistance is exhibited for a prolonged period of time.

An implementation of the present invention is contrived based on the results of studies described above, and there is thus provided a surface-coated cermet cutting tool formed by coating, on a surface of a tool substrate made of WC-based cemented carbide or TiCN-based cermet, a hard-coating layer including the following upper and lower layers (a) and (b):

(a) as the lower layer, a Ti compound layer having at least one or two of a TiC layer, a TiN layer, a TiCN layer, a TiCO layer and a TiCNO layer, all of which are deposited by chemical vapor deposition, the titanium compound layer having a total average thickness of 3 to 20 μm, and (b) as the upper layer, a heat-transformed α-type (Al, Cr)$_2$O$_3$ layer formed by carrying out a heat-transforming treatment in a state that titanium oxide particulates satisfying the composition formula: TiO$_Y$, (where value Y is 1.2 to 1.9 in an atomic ratio to Ti when measured by Auger Electron Spectroscopy) and chemically deposited as a transformation starting material are dispersedly distributed on a surface of an (Al, Cr)$_2$O$_3$ layer having a κ-type or θ-type crystal structure deposited by chemical vapor deposition and satisfying the composition formula: (Al$_{1-X}$Cr$_X$)$_2$O$_3$ (where value X is 0.005 to 0.04 in an atomic ratio when measured by an electron probe micro-analyzer (EPMA)) to thereby transform the crystal structure of the (Al, Cr)$_2$O$_3$ layer having the κ-type or θ-type crystal structure into an α-type crystal structure, the heat-transformed α-type (Al, Cr)$_2$O$_3$ layer having an average thickness of 1 to 15 μm.

Next, the reasons for limiting the numerical values in the layers constituting the hard coating layer of the coated cermet layer of an implementation of the present invention as described above will be described below.

(a) Average Thickness of Lower Layer (Ti Compound Layer)

The titanium compound layer inherently has high strength, and the hard-coating layer has high temperature strength by effect of the existence of the titanium compound layer. In addition, the titanium compound layer is firmly adhered to both of the tool substrate and the heat-transformed α-type (Al, Cr)$_2$O$_3$ layer that is the upper layer. Accordingly, it contributes to improving the adherence of the hard coating layer to the tool substrate. However, when the total average thickness is less than 3 μm, the above function cannot be sufficiently obtained. On the other hand, when the total average thickness is greater 20 μm, thermal plastic deformation is apt to occur, particularly in a high-speed intermittent cutting accompanied by the generation of high heat, which causes partial wear. Accordingly, the average thickness is preferably set to 3 to 20 μm.

(b) Value Y of Titanium Oxide Particulates

As described above, since the titanium oxide particulates serve as starting points of the cracks generated at the time of transformation of the deposited κ-type or θ-type (Al, Cr)$_2$O$_3$ layer into the α-type (Al, Cr)$_2$O$_3$ layer, the cracks generated at the time of the transformation in the heat-transformed α-type (Al, Cr)$_2$O$_3$ layer are made fine and are uniformly and dispersedly distributed. As a result, the heat-transformed α-type (Al, Cr)$_2$O$_3$ layer has excellent chipping resistance. However, when value Y thereof to Ti is less than 1.2 in an atomic ratio and when value Y is greater than 1.9, the effect of making the cracks generated at the time of the transformation fine cannot be sufficiently obtained. Therefore, value Y is set to 1.2 to 1.9 in an atomic ratio to Ti.

(c) Content Ratio of Cr in Upper Layer [a Heat-Transformed α-type (Al, Cr)$_2$O$_3$ Layer] and Average Thickness thereof since the heat-transformed α-type (Al, Cr)$_2$O$_3$ layer has excellent high temperature hardness and heat resistance by action of Al as a constituent element thereof and the fineness of the cracks generated at the time of the transformation using the Ti oxide particulates dispersedly distributed on the surface of the deposited α-type (Al, Cr)$_2$O$_3$ layer is further promoted by action of Cr as a constituent element thereof to thereby make the crystal finer, excellent wear resistance and chipping resistance can be obtained together with uniform and fine distribution of the cracks generated at the time of the heat transformation. However, when the content ratio (value X) of Cr is less than 0.005 in an atomic ratio (this is true of the following ratios) which is a ratio to the total content with Al, sufficient fineness of the cracks generated at the time of the transformation cannot be secured. On the other hand, when the content ratio of Cr is greater than 0.04, instability is caused in the transformation, which makes it difficult to sufficiently transform the κ-type or θ-type crystal structure into the α-type crystal structure during the heat-transforming treatment. Thus, the content ratio (value X) of Cr is preferably set to 0.005 to 0.04, and more preferably to 0.012 to 0.035.

Further, when the average thickness of the heat-transformed α-type (Al, Cr)$_2$O$_3$ layer is less than 1 μm, the hard coating layer cannot have sufficient high temperature hardness and heat resistance. On the other hand, when the average thickness of the heat-transformed α-type (Al, Cr)$_2$O$_3$ layer is greater than 15 μm, chipping is apt to occur, so that the average thickness of the heat-transformed α-type (Al, Cr)$_2$O$_3$ layer is preferably set to 1 to 15 μm.

Furthermore, for the purpose of identifying the cutting tool before and after using the cutting tool, the TiN layer having a gold color tone may be deposited as needed. In this case, the average thickness of the TiN layer is preferably 0.1 to 1 μm. This is because, when the average thickness is less than 0.1 μm, sufficient identification cannot be achieved, and the identification due to the TiN layer can be sufficiently obtained only with an average thickness of up to 1 μm.

In the coated cermet tool according to an implementation of the present invention, since the heat-transformed α-type (Al, Zr)$_2$O$_3$ layer or the heat-transformed α-type (Al, Ti)$_2$O$_3$ layer or the heat transformed α-type (Al, Cr)$_2$O$_3$ layer constituting the upper layer of the hard coating layer exhibits excellent high temperature hardness and heat resistance and more excellent chipping resistance even in the high-speed intermittent cutting of steel, cast iron, etc. having high mechanical and thermal impacts, excellent wear resistance can be obtained without chipping in the hard coating layer.

DETAILED DESCRIPTION OF THE PREFERRED EMBODIMENTS

Hereinafter, a coated cermet tool according to the present invention will be described in detail in conjunction with embodiments.

First Embodiment

The following powders, each having a mean particle size in a range of 1 to 3 μm, were prepared as raw materials for substrates: WC powder, TiC powder, ZrC powder, VC powder, TaC powder, NbC powder, Cr$_3$C$_2$ powder, TiN powder, TaN powder and Co powder. Those raw powders were compounded with each other based on the compounding compositions shown in Table 1, mixed with each other in an acetone solution having wax added thereto for 24 hours using a ball mill, and then were dried under reduced pressure. Thereafter, the resultant powder mixture was press-formed into a green compact having a predetermined shape at a pressure of 98 Mpa. The green compact was then sintered in a vacuum under the following conditions: a pressure of 5 Pa, a predetermined temperature in a range of 1370° C. to 1470° C., and a holding duration of 1 hour. After sintering, cutting edges were subjected to horning (R: 0.07 mm) to manufacture tool substrates A to F made of WC-based cemented carbide and having a throwaway tip shape defined in ISO Standard•CNMG120408.

Further, the following powders, each having a mean particle size in a range of 0.5 to 2 μm, were prepared as raw materials for substrates: TiCN (TiC/TiN=50/50 in weight ratio) powder, Mo$_2$C power, ZrC power, NbC powder, TaC powder, WC power, Co powder and Ni powder. Those raw powders were compounded with each other based on the compounding composition shown in Table 2, were wet-mixed with each other for 24 hours using a ball mill, and were dried. Thereafter, the resulting powder mixture was press-formed into a green compact at a pressure of 98 MPa.

The green compact was then sintered in a nitrogen atmosphere under the following conditions: a pressure of 1.3 kPa, a temperature of 1540° C., and a holding duration of 1 hour. After sintering, cutting edges were subjected to horning (R: 0.07 mm) to manufacture tool substrates a to f made of TiCN-based cermet and having a chip shape defined in ISO Standard•CNMG120412.

Next, using a general chemical vapor deposition reactor, on the surfaces of the tool substrates A to F and the tool substrates a to f, titanium compound layers as lower layers of the hard-coating layers were deposited with combinations and target thicknesses shown in Table 5 under conditions shown in Table 3 (in Table 3, l-TiCN represents formation conditions of TiCN layers having a longitudinal growth crystal structure described in Japanese Unexamined Patent Application Publication No. 6-8010, and the others represent formation conditions of general granular crystal structure). Next, similarly, (Al, Zr)$_2$O$_3$ layers having a κ-type or θ-type crystal structure were deposited with combinations and target thicknesses shown in Table 5 under conditions shown in Table 3. Subsequently, on a surface of each of the (Al, Zr)$_2$O$_3$ layers having κ-type or θ-type crystal structure, a titanium oxide particulates were deposited with a combination shown in Table 5 under conditions shown in Table 4. In this state, heat-transforming treatment was performed in an Ar atmosphere under the following conditions: a pressure of 30 kPa, a temperature of 1100° C., and a predetermined holding duration in a range of 20 to 100 minutes to transform the (Al, Zr)$_2$O$_3$ layers having a κ-type or θ-type crystal structure into (Al, Zr)$_2$O$_3$ layers having an α-type crystal structure. As a result, coated cermet tools 1 to 13 according to the embodiments of the present invention having the heat-transformed α-type (Al, Zr)$_2$O$_3$ layers as upper layers of the hard-coating layers were manufactured, respectively.

Furthermore, in manufacturing the coated cermet tools 1 to 13 according to the embodiments of the present invention, separate test pieces were prepared, and the test pieces were loaded into the same chemical vapor deposition reactor. The test pieces were taken out of the chemical vapor deposition reactor at the time point when the titanium oxide particulates are formed on the surfaces of the test pieces, and compositions (value Y) of the titanium oxide particulates were measured using an Auger Electron Spectroscopy.

For the purpose of comparison, as shown in Table 6, the deposited α-type Al$_2$O$_3$ layers as upper layers of the hard coating layers with the target thicknesses shown in Table 6 were formed under the same conditions as those shown in Table 3. Then, the conventional cermet tools 1 to 13 were manufactured under the same conditions as the above ones, except that the formation of the titanium oxide particulates and the heat-transforming treatment under the conditions mentioned above were not performed.

The layers constituting of the hard coating layers of the coated cermet tools 1 to 13 according to the embodiments of the present invention and the conventional coated cermet tools 1 to 13 were observed (longitudinal sections of the layers were observed) using an electron probe micro-analyzer (EPMA) and an Auger Electron Spectroscopy. As a result, the former all comprised the Ti compound layer and the heat-transformed α-type (Al, Zr)$_2$O$_3$ layer having substantially the same composition as the target composition, and the Ti oxide particulates deposited on the surfaces before the heat transformation treatment had substantially the same composition as the target composition in the aforementioned observation. On the other hand, it was confirmed that the latter all had the Ti compound layer and the deposited α-type Al$_2$O$_3$ layer having substantially the same composition as the target composition. In addition, the thicknesses of the layers constituting the hard coating layer of the coated cermet tool were measured (the longitudinal sections thereof were measured) using a scanning electron microscope. Here, the thicknesses all exhibited substantially the same average thicknesses (an average of values measured at five points) as the target thicknesses.

Next, in a state in which each of the above-mentioned coated cermet tools was screw-fixed to a tip of a bite made of tool steel with a fixing jig, the coated cermet tools 1 to 13 according to the embodiments of the present invention and the conventional coated cermet tools 1 to 13 were subjected to the following tests:

A dry high-speed intermittent cutting test (normal cutting speed is 200 m/min) of bearing steel under the following condition (referred to as cutting condition A):

Workpiece: a JIS•SUJ2 round bar having four longitudinal grooves equidistantly arranged in the longitudinal direction, Cutting speed: 350 m/min, Cutting depth: 1.5 mm, Feed rate: 0.20 mm/rev, Cutting time: 5 min;

A dry high-speed intermittent cutting test (normal cutting speed is 200 m/min) of alloyed steel under the following condition (referred to as cutting condition B):

Workpiece: a JIS•SCM440 round bar having four longitudinal grooves equidistantly arranged in the longitudinal direction, Cutting speed: 400 m/min, Cutting depth: 1.5 mm, Feed rate: 0.22 mm/rev, Cutting time: 5 min; and A dry high-speed intermittent cutting test (normal cutting speed is 200 m/min) of dark-tiled cast iron under the following condition (referred to as cutting condition C):

Workpiece: a JIS•FCD400 round bar having four longitudinal grooves equidistantly arranged in the longitudinal direction, Cutting speed: 400 m/min, Cutting depth: 2.0 mm, Feed rate: 0.30 mm/rev, Cutting time: 5 min, Then, the width of flank wear of a cutting edge was measured in each test. The measurement results are shown in Table 7.

TABLE 1

| Type | | Co | TiC | ZrC | VC | TaC | NbC | $Cr_3C_2$ | TiN | TaN | WC |
|---|---|---|---|---|---|---|---|---|---|---|---|
| Tool Substrate | A | 7 | — | — | — | — | — | — | — | — | Balance |
| | B | 5.7 | — | — | — | 1.5 | 0.5 | — | — | — | Balance |
| | C | 5.7 | — | — | — | — | — | 1 | — | — | Balance |
| | D | 8.5 | — | 0.5 | — | — | — | 0.5 | — | — | Balance |
| | E | 12.5 | 2 | — | — | — | — | — | 1 | 2 | Balance |
| | F | 14 | — | — | 0.2 | — | — | 0.8 | — | — | Balance |

TABLE 2

| Type | | Co | Ni | ZrC | TaC | NbC | $Mo_2C$ | WC | TiCN |
|---|---|---|---|---|---|---|---|---|---|
| Tool Substrate | a | 13 | 5 | — | 10 | — | 10 | 16 | Balance |
| | b | 8 | 7 | — | 5 | — | 7.5 | — | Balance |
| | c | 5 | — | — | — | — | 6 | 10 | Balance |
| | d | 10 | 5 | — | 11 | 2 | — | — | Balance |
| | e | 9 | 4 | 1 | 8 | — | 10 | 10 | Balance |
| | f | 12 | 5.5 | — | 10 | — | 9.5 | 14.5 | Balance |

TABLE 3

| Layer Constituting Hard Coating Layer | Target Composition (atomic ratio) | Formation Condition (kPa denotes pressure of reaction atmosphere, and ° C. denotes temperature thereof) | | |
|---|---|---|---|---|
| Type | | Reaction Gas Composition (volume %) | Pressure | Temperature |
| TiC | TiC | $TiCl_4$: 4.2%, $CH_4$: 8.5%, $H_2$: Balance | 7 | 1020 |
| TiN (First Layer) | TiN | $TiCl_4$: 4.2%, $N_2$: 30%, $H_2$: Balance | 30 | 900 |
| TiN (Other Layers) | TiN | $TiCl_4$: 4.2%, $N_2$: 35%, $H_2$: Balance | 50 | 1040 |
| l-TiCN | l-$TiC_{0.5}N_{0.5}$ | $TiCl_4$: 4.2%, $N_2$: 20%, $CH_3CN$: 0.6%, $H_2$: Balance | 7 | 900 |
| TiCN | $TiC_{0.5}N_{0.5}$ | $TiCl_4$: 4.2%, $N_2$: 20%, $CH_4$: 4%, $H_2$: Balance | 12 | 1020 |
| TiCO | $TiC_{0.5}O_{0.5}$ | $TiCl_4$: 4.2%, CO: 4%, $H_2$: Balance | 7 | 1020 |
| TiCNO | $TiC_{0.3}N_{0.3}O_{0.4}$ | $TiCl_4$: 4.2%, CO: 3%, $CH_4$: 3%, $N_2$: 20%, $H_2$: Balance | 20 | 1020 |
| α-$Al_2O_3$ | α-$Al_2O_3$ | $AlCl_3$: 2.2%, $CO_2$: 5.5%, HCl: 2.2%, $H_2S$: 0.2%, $H_2$: Balance | 7 | 1000 |
| κ-(Al, Zr)$_2$O$_3$-A | Zr (Value X): 0.003 | $AlCl_3$: 3.7%, $ZrCl_4$: 0.03%, $CO_2$: 5.5%, HCl: 2.2%, $H_2S$: 0.2%, $H_2$: Balance | 7 | 950 |
| θ-(Al, Zr)$_2$O$_3$-B | Zr (Value X): 0.01 | $AlCl_3$: 3.6%, $ZrCl_4$: 0.1%, $CO_2$: 5.5%, HCl: 2.2%, $H_2S$: 0.2%, $H_2$: Balance | 7 | 800 |
| κ-(Al, Zr)$_2$O$_3$-C | Zr (Value X): 0.017 | $AlCl_3$: 3.53% $ZrCl_4$: 0.17%, $CO_2$: 5.5%, HCl: 2.2%, $H_2S$: 0.2%, $H_2$: Balance | 7 | 950 |
| θ-(Al, Zr)$_2$O$_3$-D | Zr (Value X): 0.024 | $AlCl_3$: 3.46%, $ZrCl_4$: 0.24%, $CO_2$: 5.5%, HCl: 2.2%, $H_2S$: 0.2%, $H_2$: Balance | 7 | 800 |
| κ-(Al, Zr)$_2$O$_3$-E | Zr (Value X): 0.03 | $AlCl_3$: 3.4%, $ZrCl_4$: 0.3%, $CO_2$: 5.5%, HCl: 2.2%, $H_2S$: 0.2%, $H_2$: Balance | 7 | 950 |
| θ-(Al, Zr)$_2$O$_3$-F | Zr (Value X): 0.037 | $AlCl_3$: 3.33%, $ZrCl_4$: 0.37%, $CO_2$: 5.5%, HCl: 2.2%, $H_2S$: 0.2%, $H_2$: Balance | 7 | 800 |
| κ-(Al, Zr)$_2$O$_3$-G | Zr (Value X): 0.043 | $AlCl_3$: 3.27%, $ZrCl_4$: 0.43%, $CO_2$: 5.5%, HCl: 2.2%, $H_2S$: 0.2%, $H_2$: Balance | 7 | 950 |
| θ-(Al, Zr)$_2$O$_3$-H | Zr (Value X): 0.05 | $AlCl_3$: 3.2%, $ZrCl_4$: 0.5%, $CO_2$: 5.5%, HCl: 2.2%, $H_2S$: 0.2%, $H_2$: Balance | 7 | 800 |

TABLE 4

| Type of Ti Oxide Particulates | Target Composition of Oxide Particulates (atomic ratio) | Formation Condition | | | |
|---|---|---|---|---|---|
| | | Reaction Gas Composition (volume %) | Pressure (kPa) | Temperature (° C.) | Time (minute) |
| $TiO_γ$-a | $TiO_{1.20}$ | $TiCl_4$: 0.5%, $CO_2$: 0.2%, Ar: 40%, $H_2$: Balance | 30 | 1020 | 5 |
| $TiO_γ$-b | $TiO_{1.35}$ | $TiCl_4$: 3%, $CO_2$: 5%, Ar: 40%, $H_2$: Balance | 7 | 1000 | 3 |
| $TiO_γ$-c | $TiO_{1.50}$ | $TiCl_4$: 3%, $CO_2$: 10%, Ar: 50%, $H_2$: Balance | 14 | 1000 | 10 |

TABLE 4-continued

| Type of Ti Oxide Particulates | Target Composition of Ti Oxide Particulates (atomic ratio) | Formation Condition | | | |
|---|---|---|---|---|---|
| | | Reaction Gas Composition (volume %) | Reaction Atmosphere | | |
| | | | Pressure (kPa) | Temperature (° C.) | Time (minute) |
| TiO$_\gamma$-d | TiO$_{1.60}$ | TiCl$_4$: 1%, CO$_2$: 4.5%, Ar: 40%, H$_2$: Balance | 7 | 1000 | 7 |
| TiO$_\gamma$-e | TiO$_{1.75}$ | TiCl$_4$: 1%, CO$_2$: 8%, Ar: 10%, H$_2$: Balance | 7 | 950 | 1 |
| TiO$_\gamma$-f | TiO$_{1.90}$ | TiCl$_4$: 0.2%, CO$_2$: 5%, Ar: 5%, H$_2$: Balance | 7 | 900 | 8 |

TABLE 5

| Type | Tool Substrate Symbol | Hard Coating Layer (numeral in parentheses denotes target thickness: μm) | | | | | Ti Oxide Particulate Symbol | After Heat-Transforming Treatment |
|---|---|---|---|---|---|---|---|---|
| | | First Layer | Second Layer | Third Layer | Fourth Layer | Fifth Layer | | |
| Coated Cermet Tool of embodiments of Present Invention | 1 | A | TiN (1) | l-TiCN (17.5) | TiN (1) | TiCNO (0.5) | θ-(Al,Zr)$_2$O$_3$-B (15) | TiO$_\gamma$-c | Transformation to α-(Al,Zr)$_2$O$_3$ |
| | 2 | B | TiCN (1) | l-TiCN (8.5) | TiCO (0.5) | κ-(Al,Zr)$_2$O$_3$-A (9) | — | TiO$_\gamma$-e | Transformation to α-(Al,Zr)$_2$O$_3$ |
| | 3 | C | TiN (1) | l-TiCN (4) | TiC (4) | TiCNO (1) | κ-(Al,Zr)$_2$O$_3$-C (15) | TiO$_\gamma$-d | Transformation to α-(Al,Zr)$_2$O$_3$ |
| | 4 | D | TiC (1) | l-TiCN (9) | θ-(Al,Zr)$_2$O$_3$-D (3) | — | — | TiO$_\gamma$-f | Transformation to α-(Al,Zr)$_2$O$_3$ |
| | 5 | E | TiN (1) | l-TiCN (4.5) | TiCO (0.5) | θ-(Al,Zr)$_2$O$_3$-B (5) | — | TiO$_\gamma$-a | Transformation to α-(Al,Zr)$_2$O$_3$ |
| | 6 | F | TiN (0.5) | l-TiCN (1.5) | TiC (0.5) | TiCNO (0.5) | κ-(Al,Zr)$_2$O$_3$-G (3) | TiO$_\gamma$-b | Transformation to α-(Al,Zr)$_2$O$_3$ |
| | 7 | A | TiN (1) | l-TiCN (8) | TiCNO (0.5) | κ-(Al,Zr)$_2$O$_3$-E (1) | — | TiO$_\gamma$-e | Transformation to α-(Al,Zr)$_2$O$_3$ |
| | 8 | a | TiN (1) | TiCN (19) | θ-(Al,Zr)$_2$O$_3$-D (15) | — | — | TiO$_\gamma$-c | Transformation to α-(Al,Zr)$_2$O$_3$ |
| | 9 | b | TiC (0.5) | l-TiCN (9) | TiCO (0.5) | θ-(Al,Zr)$_2$O$_3$-D (10) | — | TiO$_\gamma$-b | Transformation to α-(Al,Zr)$_2$O$_3$ |
| | 10 | c | TiN (1) | TiC (1) | TiCN (7) | TiCO (1) | κ-(Al,Zr)$_2$O$_3$-E (15) | TiO$_\gamma$-f | Transformation to α-(Al,Zr)$_2$O$_3$ |
| | 11 | d | TiN (1) | TiC (1) | l-TiCN (8) | κ-(Al,Zr)$_2$O$_3$-C (3) | — | TiO$_\gamma$-d | Transformation to α-(Al,Zr)$_2$O$_3$ |
| | 12 | e | TiC (1) | l-TiCN (4) | TiCNO (1) | θ-(Al,Zr)$_2$O$_3$-F (5) | — | TiO$_\gamma$-c | Transformation to α-(Al,Zr)$_2$O$_3$ |
| | 13 | f | TiCN (0.5) | TiC (2) | TiCNO (0.5) | θ-(Al,Zr)$_2$O$_3$-H (1) | — | TiO$_\gamma$-a | Transformation to α-(Al,Zr)$_2$O$_3$ |

TABLE 6

| Type | Tool Substrate Symbol | Hard Coating Layer (numeral in parentheses denotes target thickness) | | | | |
|---|---|---|---|---|---|---|
| | | First Layer | Second Layer | Third Layer | Fourth Layer | Fifth Layer |
| Conventional Coated | 1 | A | TiN (1) | l-TiCN (17.5) | TiN (1) | TiCNO (0.5) | α-Al$_2$O$_3$ (15) |
| | 2 | B | TiCN (1) | l-TiCN (8.5) | TiCO (0.5) | α-Al$_2$O$_3$ (9) | — |

TABLE 6-continued

| | Tool | | Hard Coating Layer (numeral in parentheses denotes target thickness) | | | | |
|---|---|---|---|---|---|---|---|
| Type | | Substrate Symbol | First Layer | Second Layer | Third Layer | Fourth Layer | Fifth Layer |
| Cermet Tool | 3 | C | TiN (1) | l-TiCN (4) | TiC (4) | TiCNO (1) | α-Al$_2$O$_3$ (15) |
| | 4 | D | TiC (1) | l-TiCN (9) | α-Al$_2$O$_3$ (3) | — | — |
| | 5 | E | TiN (1) | l-TiCN (4.5) | TiCO (0.5) | α-Al$_2$O$_3$ (5) | — |
| | 6 | F | TiN (0.5) | l-TiCN (1.5) | TiC (0.5) | TiCNO (0.5) | α-Al$_2$O$_3$ (3) |
| | 7 | A | TiN (1) | l-TiCN (8) | TiCNO (0.5) | α-Al$_2$O$_3$ (1) | — |
| | 8 | a | TiN (1) | TiCN (19) | α-Al$_2$O$_3$ (15) | — | — |
| | 9 | b | TiC (0.5) | l-TiCN (9) | TiCO (0.5) | α-Al$_2$O$_3$ (10) | — |
| | 10 | c | TiN (1) | TiC (1) | TiCN (7) | TiCO (1) | α-Al$_2$O$_3$ (15) |
| | 11 | d | TiN (1) | TiC (1) | l-TiCN (8) | α-Al$_2$O$_3$ (3) | — |
| | 12 | e | TiC (1) | l-TiCN (4) | TiCNO (1) | α-Al$_2$O$_3$ (5) | — |
| | 13 | f | TiCN (0.5) | TiC (2) | TiCNO (0.5) | α-Al$_2$O$_3$ (3) | — |

TABLE 7

| | | Width of Flank Wear (mm) | | | | | Cutting Test Result | | |
|---|---|---|---|---|---|---|---|---|---|
| Type | | Cutting Condition A | Cutting Condition B | Cutting condition C | Type | | Cutting Condition A | Cutting Condition B | Cutting Condition C |
| Coated Cermet Tool of Present Invention | 1 | 0.18 | 0.19 | 0.22 | Conventional Coated Cermet Tool | 1 | Usable life of 3.1 minutes | Usable life of 2.9 minutes | Usable life of 1.7 minutes |
| | 2 | 0.16 | 0.15 | 0.20 | | 2 | Usable life of 2.8 minutes | Usable life of 2.4 minutes | Usable life of 1.3 minutes |
| | 3 | 0.14 | 0.13 | 0.16 | | 3 | Usable life of 2.0 minutes | Usable life of 1.5 minutes | Usable life of 1.1 minutes |
| | 4 | 0.19 | 0.25 | 0.27 | | 4 | Usable life of 2.7 minutes | Usable life of 3.0 minutes | Usable life of 2.0 minutes |
| | 5 | 0.23 | 0.29 | 0.30 | | 5 | Usable life of 3.3 minutes | Usable life of 3.3 minutes | Usable life of 2.9 minutes |
| | 6 | 0.25 | 0.34 | 0.41 | | 6 | Usable life of 3.9 minutes | Usable life of 3.7 minutes | Usable life of 3.2 minutes |
| | 7 | 0.20 | 0.23 | 0.25 | | 7 | Usable life of 3.8 minutes | Usable life of 3.2 minutes | Usable life of 2.4 minutes |
| | 8 | 0.17 | 0.27 | 0.30 | | 8 | Usable life of 2.7 minutes | Usable life of 2.5 minutes | Usable life of 2.8 minutes |
| | 9 | 0.13 | 0.16 | 0.16 | | 9 | Usable life of 2.1 minutes | Usable life of 1.3 minutes | Usable life of 1.5 minutes |
| | 10 | 0.11 | 0.14 | 0.14 | | 10 | Usable life of 1.9 minutes | Usable life of 1.1 minutes | Usable life of 1.2 minutes |
| | 11 | 0.13 | 0.18 | 0.19 | | 11 | Usable life of 2.3 minutes | Usable life of 1.9 minutes | Usable life of 2.0 minutes |
| | 12 | 0.15 | 0.21 | 0.23 | | 12 | Usable life of 2.5 minutes | Usable life of 2.2 minutes | Usable life of 2.5 minutes |

TABLE 7-continued

| | Width of Flank Wear (mm) | | | | Cutting Test Result | | |
|---|---|---|---|---|---|---|---|
| Type | Cutting Condition A | Cutting Condition B | Cutting condition C | Type | Cutting Condition A | Cutting Condition B | Cutting Condition C |
| 13 | 0.21 | 0.33 | 0.38 | 13 | Usable life of 3.1 minutes | Usable life of 2.9 minutes | Usable life of 3.0 minutes |

(In Table 7, usable life is caused by the chipping generated on the hard coating layer.)

As can be seen apparently from the results shown in Tables 5 to 7, in all the cermet tools 1 to 13 according to the embodiments of the present invention, the heat-transformed α-type (Al, Zr)$_2$O$_3$ layer constituting the upper layer of each hard coating layer has excellent high temperature hardness and heat resistance and high strength, and exhibits excellent chipping resistance due to the heat-transformed α-type structure, thereby showing excellent wear resistance, even in the high-speed intermittent cutting of steel or cast iron with very high mechanical and thermal impacts. However, in all the conventional coated cermet tools 1 to 13, the deposited α-type Al$_2$O$_3$ layers could not resist to severe mechanical and thermal impacts in the high-speed intermittent cutting and thus the chipping is generated in the hard coating layers, thereby shortening the usable life of the conventional cermet cutting tools.

Second Embodiment

Next, using a general chemical vapor deposition reactor, on the surfaces of the tool substrates A to F and the tool substrates a to f equal to those used in the first embodiment, titanium compound layers as lower layers of the hard-coating layers were deposited with combinations and target thicknesses shown in Table 9 under conditions shown in Table 8 (in Table 8, l-TiCN represents formation conditions of TiCN layers having a longitudinal growth crystal structure described in Japanese Unexamined Patent Application Publication No. 6-8010, and the others represent formation conditions of general granular crystal structure). Next, similarly, (Al, Ti)$_2$O$_3$ layers having a κ-type or θ-type crystal structure were deposited with combinations and target thicknesses shown in Table 9 under conditions shown in Table 8. Subsequently, on a surface of each of the (Al, Ti)$_2$O$_3$ layers having κ-type or θ-type crystal structure, a titanium oxide particulates were deposited with a combination shown in Table 9 under conditions shown in Table 4. In this state, heat-transforming treatment was performed in an Ar atmosphere under the following conditions: a pressure of 30 kPa, a temperature of 1100° C., and a predetermined holding duration in a range of 20 to 100 minutes to transform the (Al, Ti)$_2$O$_3$ layers having a κ-type or θ-type crystal structure into (Al, Ti)$_2$O$_3$ layers having an α-type crystal structure. As a result, coated cermet tools 14 to 26 according to the embodiments of the present invention having the heat-transformed α-type (Al, Ti)$_2$O$_3$ layers as upper layers of the hard-coating layers were manufactured, respectively.

Furthermore, in manufacturing the coated cermet tools 14 to 26 according to the embodiments of the present invention, separate test pieces were prepared, and the test pieces were loaded into the same chemical vapor deposition reactor. The test pieces were taken out of the chemical vapor deposition reactor at the time point when the titanium oxide particulates are formed on the surfaces of the test pieces, and compositions (value Y) of the titanium oxide particulates were measured using an Auger Electron Spectroscopy.

For the purpose of comparison, as shown in Table 6, the deposited α-type Al$_2$O$_3$ layers as upper layers of the hard coating layers with the target thicknesses shown in Table 6 were formed-under the conditions shown in Table 8. Then, the conventional cermet tools 1 to 13 were manufactured under the same conditions as the above ones, except that the formation of the titanium oxide particulates and the heat-transforming treatment under the conditions mentioned above were not performed.

The layers constituting of the hard coating layers of the coated cermet tools 14 to 26 according to the embodiments of the present invention and the conventional coated cermet tools 1 to 13 were observed (longitudinal sections of the layers were observed) using an electron probe micro-analyzer (EPMA) and an Auger Electron Spectroscopy. As a result, the former all comprised the Ti compound layer and the heat-transformed α-type (Al, Ti)$_2$O$_3$ layer having substantially the same composition as the target composition, and the Ti oxide particulates deposited on the surfaces before the heat transformation treatment had substantially the same composition as the target composition in the aforementioned observation. On the other hand, it was confirmed that the latter all had the Ti compound layer and the deposited α-type Al$_2$O$_3$ layer having substantially the same composition as the target composition. In addition, the thicknesses of the layers constituting the hard coating layer of the coated cermet tool were measured (the longitudinal sections thereof were measured) using a scanning electron microscope. Here, the thicknesses all exhibited substantially the same average thicknesses (an average of values measured at five points) as the target thicknesses.

Next, in a state in which each of the above-mentioned coated cermet tools was screw-fixed to a tip of a bite made of tool steel with a fixing jig, the coated cermet tools 14 to 26 according to the embodiments of the present invention and the conventional coated cermet tools 1 to 13 were subjected to the following tests:

A dry high-speed intermittent cutting test (normal cutting speed is 250 m/min) of alloy steel under the following condition:

Workpiece: a JIS•SCr420 round bar having four longitudinal grooves equidistantly arranged in the longitudinal direction, Cutting speed: 450 m/min, Cutting depth: 1.5 mm, Feed rate: 0.3 mm/rev, Cutting time: 5 min;

A dry high-speed intermittent cutting test (normal cutting speed is 200 m/min) of carbon steel under the following condition:

Workpiece: a JIS•S20C round bar having four longitudinal grooves equidistantly arranged in the longitudinal direction, Cutting speed: 400 m/min,
Cutting depth: 1.5 mm,
Feed rate: 0.3 mm/rev,
Cutting time: 5 min; and A dry high-speed intermittent cutting test (normal cutting speed is 250 m/min) of cast iron under the following condition:

Workpiece: a JIS•FC300 round bar having four longitudinal grooves equidistantly arranged in the longitudinal direction, Cutting speed: 500 m/min,
Cutting depth: 1.5 mm,
Feed rate: 0.3 mm/rev,
Cutting time: 5 min, Then, the width of flank wear of a cutting edge was measured in each test. The measurement results are shown in Table 10.

TABLE 9

| Layer Constituting Hard Coating Layer | | Formation Condition (kPa denotes pressure of reaction atmosphere, and ° C. denotes temperature thereof) | | |
|---|---|---|---|---|
| | | | Reaction Atmosphere | |
| Type | Composition (atomic ratio) | Reaction Gas Composition (volume %) | Pressure | Temperature |
| TiC | TiC | $TiCl_4$: 4.2%, $CH_4$: 8.5%, $H_2$: Balance | 7 | 1020 |
| TiN (First Layer) | TiN | $TiCl_4$: 4.2%, $N_2$: 30%, $H_2$: Balance | 30 | 900 |
| TiN (Other Layers) | TiN | $TiCl_4$: 4.2%, $N_2$: 35%, $H_2$: Balance | 50 | 1040 |
| l-TiCN | l-TiC$_{0.5}$N$_{0.5}$ | $TiCl_4$: 4.2%, $N_2$: 20%, $CH_3CN$: 0.6%, $H_2$: Balance | 7 | 900 |
| TiCN | TiC$_{0.5}$N$_{0.5}$ | $TiCl_4$: 4.2%, $N_2$: 20%, $CH_4$: 4%, $H_2$: Balance | 12 | 1020 |
| TiCO | TiC$_{0.5}$O$_{0.5}$ | $TiCl_4$: 4.2%, CO: 4%, $H_2$: Balance | 7 | 1020 |
| TiCNO | TiC$_{0.3}$N$_{0.3}$O$_{0.4}$ | $TiCl_4$: 4.2%, CO: 3%, $CH_4$: 3%, $N_2$: 20%, $H_2$: Balance | 20 | 1020 |
| α-$Al_2O_3$ | α-$Al_2O_3$ | $AlCl_3$: 2.2%, $CO_2$: 5.5%, HCl: 2.2%, $H_2S$: 0.2%, $H_2$: Balance | 7 | 1000 |
| κ-(Al,Ti)$_2$O$_3$-A | Ti (Value X): 0.01 | $AlCl_3$: 3.27%, $TiCl_4$: 0.03%, $CO_2$: 5.5%, HCl: 2.2%, $H_2S$: 0.2%, $H_2$: Balance | 7 | 950 |
| θ-(Al,Ti)$_2$O$_3$-B | Ti (Value X): 0.015 | $AlCl_3$: 4.24%, $TiCl_4$: 0.07%, $CO_2$: 5.5%, HCl: 2.2%, $H_2S$: 0.2%, $H_2$: Balance | 7 | 800 |
| κ-(Al,Ti)$_2$O$_3$-C | Ti (Value X): 0.02 | $AlCl_3$: 3.23%, $TiCl_4$: 0.07%, $CO_2$: 5.5%, HCl: 2.2%, $H_2S$: 0.2%, $H_2$: Balance | 7 | 950 |
| θ-(Al,Ti)$_2$O$_3$-D | Ti (Value X): 0.025 | $AlCl_3$: 4.19%, $TiCl_4$: 0.11%, $CO_2$: 5.5%, HCl: 2.2%, $H_2S$: 0.2%, $H_2$: Balance | 7 | 800 |
| κ-(Al,Ti)$_2$O$_3$-E | Ti (Value X): 0.03 | $AlCl_3$: 3.20%, $TiCl_4$: 0.10%, $CO_2$: 5.5%, HCl: 2.2%, $H_2S$: 0.2%, $H_2$: Balance | 7 | 950 |
| θ-(Al,Ti)$_2$O$_3$-F | Ti (Value X): 0.035 | $AlCl_3$: 4.15%, $TiCl_4$: 0.15%, $CO_2$: 5.5%, HCl: 2.2%, $H_2S$: 0.2%, $H_2$: Balance | 7 | 800 |
| κ-(Al,Ti)$_2$O$_3$-G | Ti (Value X): 0.04 | $AlCl_3$: 3.17%, $TiCl_4$: 0.13%, $CO_2$: 5.5%, HCl: 2.2%, $H_2S$: 0.2%, $H_2$: Balance | 7 | 950 |
| θ-(Al,Ti)$_2$O$_3$-H | Ti (Value X): 0.05 | $AlCl_3$: 4.09%, $TiCl_4$: 0.22%, $CO_2$: 5.5%, HCl: 2.2%, $H_2S$: 0.2%, $H_2$: Balance | 7 | 800 |

TABLE 9

| | Tool | | Hard Coating Layer (numeral in parentheses denotes target thickness: μm) | | | | | Ti Oxide | After Heat |
|---|---|---|---|---|---|---|---|---|---|
| Type | | Substrate Symbol | First Layer | Second Layer | Third Layer | Fourth Layer | Fifth Layer | Particulate Symbol | Transforming Treatment |
| Coated Cermet | 14 | A | TiN (1) | l-TiCN (17.5) | TiN (1) | TiCNO (0.5) | θ-(Al,Ti)$_2$O$_3$-B (15) | TiO$_γ$-c | Transformation to α-(Al,Ti)$_2$O$_3$ |

TABLE 9-continued

| Type | Tool Substrate Symbol | | Hard Coating Layer (numeral in parentheses denotes target thickness: μm) | | | | | Ti Oxide Particulate Symbol | After Heat Transforming Treatment |
|---|---|---|---|---|---|---|---|---|---|
| | | | First Layer | Second Layer | Third Layer | Fourth Layer | Fifth Layer | | |
| Tool of embodiments of Present Invention | 15 | B | TiCN (1) | l-TiCN (8.5) | TiCO (0.5) | κ-(Al,Ti)₂O₃-A (9) | — | TiO_γ-a | Transformation to α-(Al,Ti)₂O₃ |
| | 16 | C | TiN (1) | l-TiCN (4) | TiC (4) | TiCNO (1) | κ-(Al,Ti)₂O₃-C (15) | TiO_γ-d | Transformation to α-(Al,Ti)₂O₃ |
| | 17 | D | TiC (1) | l-TiCN (9) | θ-(Al,Ti)₂O₃-D (3) | — | — | TiO_γ-f | Transformation to α-(Al,Ti)₂O₃ |
| | 18 | E | TiN (1) | l-TiCN (4.5) | TiCO (0.5) | θ-(Al,Ti)₂O₃-B (5) | — | TiO_γ-a | Transformation to α-(Al,Ti)₂O₃ |
| | 19 | F | TiN (0.5) | l-TiCN (1.5) | TiC (0.5) | TiCNO (0.5) | κ-(Al,Ti)₂O₃-G (3) | TiO_γ-b | Transformation to α-(Al,Ti)₂O₃ |
| | 20 | A | TiN (1) | l-TiCN (8) | TiCNO (0.5) | κ-(Al,Ti)₂O₃-E (1) | — | TiO_γ-c | Transformation to α-(Al,Ti)₂O₃ |
| | 21 | a | TiN (1) | TiCN (19) | θ-(Al,Ti)₂O₃-E (15) | — | — | TiO_γ-e | Transformation to α-(Al,Ti)₂O₃ |
| | 22 | b | TiC (0.5) | l-TiCN (9) | TiCO (0.5) | θ-(Al,Ti)₂O₃-D (10) | — | TiO_γ-a | Transformation to α-(Al,Ti)₂O₃ |
| | 23 | c | TiN (1) | TiC (1) | TiCN (7) | TiCO (1) | κ-(Al,Ti)₂O₃-E (15) | TiO_γ-d | Transformation to α-(Al,Ti)₂O₃ |
| | 24 | d | TiN (1) | TiC (1) | l-TiCN (8) | κ-(Al,Ti)₂O₃-C (3) | — | TiO_γ-f | Transformation to α-(Al,Ti)₂O₃ |
| | 25 | e | TiC (1) | l-TiCN (4) | TiCNO (1) | θ-(Al,Ti)₂O₃-F (5) | — | TiO_γ-b | Transformation to α-(Al,Ti)₂O₃ |
| | 26 | f | TiCN (0.5) | TiC (2) | TiCNO (0.5) | θ-(Al,Ti)₂O₃-H (1) | — | TiO_γ-e | Transformation to α-(Al,Ti)₂O₃ |

TABLE 10

| Type | | Width of Flank Wear (mm) | | | Type | | Cutting Test Result | | |
|---|---|---|---|---|---|---|---|---|---|
| | | Alloy Steel | Carbon Steel | Cast Iron | | | Alloy Steel | Carbon Steel | Cast Iron |
| Coated Cermet Tool of embodiments of Present Invention | 14 | 0.12 | 0.10 | 0.11 | Conventional Coated Cermet Tool | 1 | Usable life of 1.2 minutes | Usable life of 1.1 minutes | Usable life of 1.4 minutes |
| | 15 | 0.16 | 0.14 | 0.15 | | 2 | Usable life of 1.5 minutes | Usable life of 1.4 minutes | Usable life of 1.7 minutes |
| | 16 | 0.15 | 0.14 | 0.15 | | 3 | Usable life of 1.5 minutes | Usable life of 1.3 minutes | Usable life of 1.6 minutes |
| | 17 | 0.18 | 0.16 | 0.17 | | 4 | Usable life of 1.7 minutes | Usable life of 1.7 minutes | Usable life of 1.9 minutes |
| | 18 | 0.20 | 0.18 | 0.19 | | 5 | Usable life of 2.0 minutes | Usable life of 1.9 minutes | Usable life of 2.2 minutes |
| | 19 | 0.22 | 0.19 | 0.20 | | 6 | Usable life of 2.8 minutes | Usable life of 2.6 minutes | Usable life of 2.9 minutes |
| | 20 | 0.21 | 0.18 | 0.19 | | 7 | Usable life of 2.0 minutes | Usable life of 1.8 minutes | Usable life of 2.2 minutes |
| | 21 | 0.13 | 0.12 | 0.13 | | 8 | Usable life of 1.3 minutes | Usable life of 1.2 minutes | Usable life of 1.5 minutes |
| | 22 | 0.15 | 0.13 | 0.14 | | 9 | Usable life of 1.5 minutes | Usable life of 1.3 minutes | Usable life of 1.7 minutes |

TABLE 10-continued

| Type | Width of Flank Wear (mm) | | | Type | Cutting Test Result | | |
|---|---|---|---|---|---|---|---|
| | Alloy Steel | Carbon Steel | Cast Iron | | Alloy Steel | Carbon Steel | Cast Iron |
| 23 | 0.14 | 0.12 | 0.14 | 10 | Usable life of 1.4 minutes | Usable life of 1.3 minutes | Usable life of 1.5 minutes |
| 24 | 0.19 | 0.17 | 0.18 | 11 | Usable life of 1.6 minutes | Usable life of 1.4 minutes | Usable life of 1.8 minutes |
| 25 | 0.18 | 0.16 | 0.17 | 12 | Usable life of 2.0 minutes | Usable life of 1.8 minutes | Usable life of 2.1 minutes |
| 26 | 0.21 | 0.20 | 0.20 | 13 | Usable life of 2.5 minutes | Usable life of 2.3 minutes | Usable life of 2.7 minutes |

[In Table 10, usable life is caused by the chipping generated in the hard coating layer]

As can be seen apparently from the results shown in Tables 6, 9, and 10, in all the cermet tools 14 to 26 according to the embodiments of the present invention, the heat-transformed α-type (Al, Ti)$_2$O$_3$ layer constituting the upper layer of each hard coating layer has excellent high temperature hardness and heat resistance, and exhibits excellent chipping resistance, thereby showing excellent wear resistance, even in the high-speed intermittent cutting of steel or cast iron with very high mechanical and thermal impacts. However, in all the conventional coated cermet tools 1 to 13, the deposited α-type Al$_2$O$_3$ layers could not resist to severe mechanical and thermal impacts in the high-speed intermittent cutting and thus the chipping is generated in the hard coating layers, thereby shortening the usable life of the conventional cermet cutting tools.

Third Embodiment

Next, using a general chemical vapor deposition reactor, on the surfaces of the tool substrates A to F and the tool substrates a to f equal to those used in the first embodiment, titanium compound layers as lower layers of the hard-coating layers were deposited with combinations and target thicknesses shown in Table 13 under conditions shown in Table 11 (in Table 11, l-TiCN represents formation conditions of TiCN layers having a longitudinal growth crystal structure described in Japanese Unexamined Patent Application Publication No. 6-8010, and the others represent formation conditions of general granular crystal structure). Next, similarly, (Al, Cr)$_2$O$_3$ layers having a κ-type or θ-type crystal structure were deposited with combinations and target thicknesses shown in Table 13 under conditions shown in Table 11. Subsequently, on a surface of each of the (Al, Cr)$_2$O$_3$ layers having κ-type or θ-type crystal structure, a titanium oxide particulates were deposited with a combination shown in Table 13 under conditions shown in Table 12. In this state, heat-transforming treatment was performed in an Ar atmosphere under the following conditions: a pressure of 30 kPa, a temperature of 1100° C., and a predetermined holding duration in a range of 20 to 100 minutes to transform the (Al, Cr)$_2$O$_3$ layers having a κ-type or θ-type crystal structure into (Al, Cr)$_2$O$_3$ layers having an α-type crystal structure. As a result, coated cermet tools 27 to 39 according to the embodiments of the present invention having the heat-transformed α-type (Al, Cr)$_2$O$_3$ layers as upper layers of the hard-coating layers were manufactured, respectively.

Furthermore, in manufacturing the coated cermet tools 27 to 39 according to the embodiments of the present invention, separate test pieces were prepared, and the test pieces were loaded into the same chemical vapor deposition reactor. The test pieces were taken out of the chemical vapor deposition reactor at the time point when the titanium oxide particulates are formed on the surfaces of the test pieces, and compositions (value Y) of the titanium oxide particulates were measured using an Auger Electron Spectroscopy.

For the purpose of comparison, as shown in Table 6, the deposited α-type Al$_2$O$_3$ layers as upper layers of the hard coating layers with the target thicknesses shown in Table 6 were formed under the conditions shown in Table 11. Then, the conventional cermet tools 1 to 13 were manufactured under the same conditions as the above ones, except that the formation of the titanium oxide particulates and the heat-transforming treatment under the conditions mentioned above were not performed.

The layers constituting of the hard coating layers of the coated cermet tools 27 to 39 according to the embodiments of the present invention and the conventional coated cermet tools 1 to 13 were observed (longitudinal sections of the layers were observed) using an electron probe micro-analyzer (EPMA) and an Auger Electron Spectroscopy. As a result, the former all comprised the Ti compound layer and the heat-transformed α-type (Al, Cr)$_2$O$_3$ layer having substantially the same composition as the target composition, and the Ti oxide particulates deposited on the surfaces before the heat transformation treatment had substantially the same composition as the target composition in the aforementioned observation. On the other hand, it was confirmed that the latter all had the Ti compound layer and the deposited (α-type $Al_2O_3$ layer having substantially the same composition as the target composition. In addition, the thicknesses of the layers constituting the hard coating layer of the coated cermet tool were measured (the longitudinal sections thereof were measured) using a scanning electron microscope. Here, the thicknesses all exhibited substantially the same average thicknesses (an average of values measured at five points) as the target thicknesses.

Next, in a state in which each of the above-mentioned coated cermet tools was screw-fixed to a tip of a bite made of tool steel with a fixing jig, the coated cermet tools 27 to 39 according to the embodiments of the present invention and the conventional coated cermet tools 1 to 13 were subjected to the following tests:

A dry high-speed intermittent cutting test (normal cutting speed is 250 m/min) of carbon steel under the following condition:

Workpiece: a JIS•S45C round bar having four longitudinal grooves equidistantly arranged in the longitudinal direction, Cutting speed: 400 m/min, Cutting depth: 1.0 mm, Feed rate: 0.2 mm/rev, Cutting time: 5 min;

A dry high-speed intermittent cutting test (normal cutting speed is 200 m/min) of alloy steel under the following condition:

Workpiece: a JIS•SCM440 round bar having four longitudinal grooves equidistantly arranged in the longitudinal direction, Cutting speed: 350 m/min, Cutting depth: 1.5 mm, Feed rate: 0.3 mm/rev, Cutting time: 5 min; and A dry high-speed intermittent cutting test (normal cutting speed is 300 m/min) of cast iron under the following condition:

Workpiece: a JIS•FC300 round bar having four longitudinal grooves equidistantly arranged in the longitudinal direction, Cutting speed: 450 m/min, Cutting depth: 2.0 mm, Feed rate: 0.25 mm/rev, Cutting time: 5 min, Then, the width of flank wear of a cutting edge was measured in each test. The measurement results are shown in Table 14.

TABLE 11

| Layer Constituting Hard Coating Layer | | Formation Condition (kPa denotes pressure of reaction atmosphere, and ° C. denotes temperature thereof) | | |
| --- | --- | --- | --- | --- |
| | Target Composition | Reaction Gas | Reaction Atmosphere | |
| Type | (atomic ratio) | Composition (volume %) | Pressure | Temperature |
| TiC | TiC | $TiCl_4$: 4.2%, $CH_4$: 8.5%, $H_2$: Balance | 7 | 1020 |
| TiN (First Layer) | TiN | $TiCl_4$: 4.2%, $N_2$: 30%, $H_2$: Balance | 30 | 900 |
| TiN (Other Layers) | TiN | $TiCl_4$: 4.2%, $N_2$: 35%, $H_2$: Balance | 50 | 1040 |
| l-TiCN | l-$TiC_{0.5}N_{0.5}$ | $TiCl_4$: 4.2%, $N_2$: 20%, $CH_3CN$: 0.6%, $H_2$: Balance | 7 | 1000 |
| TiCN | $TiC_{0.5}N_{0.5}$ | $TiCl_4$: 4.2%, $N_2$: 20%, $CH_4$: 4%, $H_2$: Balance | 12 | 1020 |
| TiCO | $TiC_{0.5}O_{0.5}$ | $TiCl_4$: 4.2%, CO: 4%, $H_2$: Balance | 7 | 1020 |
| TiCNO | $TiC_{0.3}N_{0.3}O_{0.4}$ | $TiCl_4$: 4.2%, CO: 3%, $CH_4$: 3%, $N_2$: 20%, $H_2$: Balance | 20 | 1020 |
| α-$Al_2O_3$ | α-$Al_2O_3$ | $AlCl_3$: 2.2%, $CO_2$: 5.5%, HCl: 2.2%, $H_2S$: 0.2%, $H_2$: Balance | 7 | 1000 |
| κ-(Al,Cr)$_2O_3$-A | Cr (Value X): 0.005 | $AlCl_3$: 2.5%, $CrCl_3$: 0.05%, $CO_2$: 2.2%, HCl: 3%, $H_2S$: 0.1%, $H_2$: Balance | 7 | 950 |
| θ-(Al,Cr)$_2O_3$-B | Cr (Value X): 0.012 | $AlCl_3$: 2.5%, $CrCl_3$: 0.08%, $CO_2$: 2.2%, HCl: 3%, $H_2S$: 0.3%, $H_2$: Balance | 7 | 800 |
| κ-(Al,Cr)$_2O_3$-C | Cr (Value X): 0.02 | $AlCl_3$: 2.3% $CrCl_3$: 0.08%, $CO_2$: 2.2%, HCl: 3%, $H_2S$: 0.1%, $H_2$: Balance | 7 | 950 |
| θ-(Al,Cr)$_2O_3$-D | Cr (Value X): 0.025 | $AlCl_3$: 2.3%, $CrCl_3$: 0.1%, $CO_2$: 2.2%, HCl: 3%, $H_2S$: 0.3%, $H_2$: Balance | 7 | 800 |
| κ-(Al,Cr)$_2O_3$-E | Cr (Value X): 0.03 | $AlCl_3$: 2.2%, $CrCl_3$: 0.1%, $CO_2$: 2%, HCl: 3%, $H_2S$: 0.1%, $H_2$: Balance | 7 | 950 |
| θ-(Al,Cr)$_2O_3$-F | Cr (Value X): 0.035 | $AlCl_3$: 2.2%, $CrCl_3$: 0.12%, $CO_2$: 2%, HCl: 3%, $H_2S$: 0.3%, $H_2$: Balance | 7 | 800 |
| κ-(Al,Cr)$_2O_3$-G | Cr (Value X): 0.04 | $AlCl_3$: 2.2%, $CrCl_3$: 0.15%, $CO_2$: 2%, HCl: 3%, $H_2S$: 0.1%, $H_2$: Balance | 7 | 950 |

TABLE 12

| | Target Composition of Ti Oxide Particulates (atomic ratio) | Formation Condition | | | |
| --- | --- | --- | --- | --- | --- |
| | | | Reaction Atmosphere | | |
| Type of Ti Oxide Particulates | | Reaction Gas Composition (volume %) | Pressure (kPa) | Temperature (° C.) | Time (minute) |
| $TiO_\gamma$-a | $TiO_{1.20}$ | $TiCl_4$: 0.5%, $CO_2$: 0.2%, Ar: 40%, $H_2$: Balance | 30 | 1020 | 10 |

TABLE 12-continued

| Type of Ti Oxide Particulates | Target Composition of Ti Oxide Particulates (atomic ratio) | Formation Condition | | | |
|---|---|---|---|---|---|
| | | Reaction Gas Composition (volume %) | Reaction Atmosphere Pressure (kPa) | Temperature (° C.) | Time (minute) |
| $TiO_\gamma$-b | $TiO_{1.35}$ | $TiCl_4$: 3%, $CO_2$: 5%, Ar: 40%, $H_2$: Balance | 7 | 1000 | 10 |
| $TiO_\gamma$-c | $TiO_{1.50}$ | $TiCl_4$: 3%, $CO_2$: 10%, Ar: 50%, $H_2$: Balance | 14 | 1000 | 7 |
| $TiO_\gamma$-d | $TiO_{1.60}$ | $TiCl_4$: 1%, $CO_2$: 4.5%, Ar: 40%, $H_2$: Balance | 7 | 1000 | 15 |
| $TiO_\gamma$-e | $TiO_{1.75}$ | $TiCl_4$: 1%, $CO_2$: 8%, Ar: 10%, $H_2$: Balance | 7 | 950 | 15 |
| $TiO_\gamma$-f | $TiO_{1.90}$ | $TiCl_4$: 0.2%, $CO_2$: 5%, Ar: 5%, $H_2$: Balance | 7 | 900 | 20 |

TABLE 13

| Type | Tool Substrate Symbol | Hard Coating Layer (numeral in parentheses denotes target thickness: μm) | | | | | Ti Oxide Particulate Symbol | After Heat Transforming Treatment |
|---|---|---|---|---|---|---|---|---|
| | | First Layer | Second Layer | Third Layer | Fourth Layer | Fifth Layer | | |
| Coated Cermet Tool of embodiments of Present Invention | 27 | A | TiN (1) | l-TiCN (17.5) | TiN (1) | TiCNO (0.5) | θ-$(Al,Cr)_2O_3$-B (15) | $TiO_\gamma$-d | Transformation to α-$(Al,Cr)_2O_3$ |
| | 28 | B | TiCN (1) | l-TiCN (8.5) | TiCO (0.5) | κ-$(Al,Cr)_2O_3$-A (9) | — | $TiO_\gamma$-b | Transformation to α-$(Al,Cr)_2O_3$ |
| | 29 | C | TiN (1) | l-TiCN (4) | TiC (4) | TiCNO (1) | κ-$(Al,Cr)_2O_3$-C (15) | $TiO_\gamma$-a | Transformation to α-$(Al,Cr)_2O_3$ |
| | 30 | D | TiC (1) | l-TiCN (9) | θ-$(Al,Cr)_2O_3$-D (3) | — | — | $TiO_\gamma$-c | Transformation to α-$(Al,Cr)_2O_3$ |
| | 31 | E | TiN (1) | l-TiCN (4.5) | TiCO (0.5) | κ-$(Al,Cr)_2O_3$-E (5) | — | $TiO_\gamma$-e | Transformation to α-$(Al,Cr)_2O_3$ |
| | 32 | F | TiN (0.5) | l-TiCN (1.5) | TiC (0.5) | TiCNO (0.5) | κ-$(Al,Cr)_2O_3$-G (3) | $TiO_\gamma$-f | Transformation to α-$(Al,Cr)_2O_3$ |
| | 33 | A | TiN (1) | l-TiCN (8) | TiCNO (0.5) | κ-$(Al,Cr)_2O_3$-E (1) | — | $TiO_\gamma$-c | Transformation to α-$(Al,Cr)_2O_3$ |
| | 34 | a | TiN (1) | TiCN (19) | θ-$(Al,Cr)_2O_3$-D (15) | — | — | $TiO_\gamma$-b | Transformation to α-$(Al,Cr)_2O_3$ |
| | 35 | b | TiC (0.5) | l-TiCN (9) | TiCO (0.5) | θ-$(Al,Cr)_2O_3$-D (10) | — | $TiO_\gamma$-f | Transformation to α-$(Al,Cr)_2O_3$ |
| | 36 | c | TiN (1) | TiC (1) | TiCN (7) | TiCO (1) | κ-$(Al,Cr)_2O_3$-D (15) | $TiO_\gamma$-a | Transformation to α-$(Al,Cr)_2O_3$ |
| | 37 | d | TiN (1) | TiC (1) | l-TiCN (8) | κ-$(Al,Cr)_2O_3$-C (3) | — | $TiO_\gamma$-e | Transformation to α-$(Al,Cr)_2O_3$ |
| | 38 | e | TiC (1) | l-TiCN (4) | TiCNO (1) | θ-$(Al,Cr)_2O_3$-F (5) | — | $TiO_\gamma$-c | Transformation to α-$(Al,Cr)_2O_3$ |
| | 39 | f | TiCN (0.5) | TiC (2) | TiCNO (0.5) | θ-$(Al,Cr)_2O_3$-B (1) | — | $TiO_\gamma$-d | Transformation to α-$(Al,Cr)_2O_3$ |

TABLE 14

| Type | | Width of Flank Wear (mm) | | | Type | Cutting Test Result | | |
|---|---|---|---|---|---|---|---|---|
| | | Alloy Steel | Carbon Steel | Cast Iron | | Alloy Steel | Carbon Steel | Cast Iron |
| Coated Cermet | 27 | 0.22 | 0.25 | 0.24 | Conventional Coated | 1 | Usable life of | Usable life of | Usable life of |

TABLE 14-continued

| Type | Width of Flank Wear (mm) | | | Type | Cutting Test Result | | |
|---|---|---|---|---|---|---|---|
| | Alloy Steel | Carbon Steel | Cast Iron | | Alloy Steel | Carbon Steel | Cast Iron |
| Tool of embodiments of Present Invention 28 | 0.18 | 0.21 | 0.23 | Cermet Tool 2 | 2.5 minutes Usable life of 2.3 minutes | 2.2 minutes Usable life of 2.0 minutes | 2.4 minutes Usable life of 2.3 minutes |
| 29 | 0.15 | 0.17 | 0.20 | 3 | Usable life of 2.1 minutes | Usable life of 1.7 minutes | Usable life of 2.0 minutes |
| 30 | 0.25 | 0.26 | 0.26 | 4 | Usable life of 2.8 minutes | Usable life of 2.6 minutes | Usable life of 3.0 minutes |
| 31 | 0.30 | 0.33 | 0.35 | 5 | Usable life of 3.2 minutes | Usable life of 3.0 minutes | Usable life of 3.3 minutes |
| 32 | 0.34 | 0.36 | 0.40 | 6 | Usable life of 3.5 minutes | Usable life of 3.3 minutes | Usable life of 3.6 minutes |
| 33 | 0.26 | 0.29 | 0.30 | 7 | Usable life of 3.1 minutes | Usable life of 3.9 minutes | Usable life of 3.2 minutes |
| 34 | 0.28 | 0.31 | 0.34 | 8 | Usable life of 2.8 minutes | Usable life of 3.5 minutes | Usable life of 2.7 minutes |
| 35 | 0.15 | 0.17 | 0.20 | 9 | Usable life of 1.5 minutes | Usable life of 2.2 minutes | Usable life of 1.6 minutes |
| 36 | 0.13 | 0.15 | 0.18 | 10 | Usable life of 1.3 minutes | Usable life of 1.0 minutes | Usable life of 1.5 minutes |
| 37 | 0.20 | 0.23 | 0.24 | 11 | Usable life of 2.3 minutes | Usable life of 2.0 minutes | Usable life of 2.7 minutes |
| 38 | 0.25 | 0.28 | 0.30 | 12 | Usable life of 2.5 minutes | Usable life of 2.3 minutes | Usable life of 2.9 minutes |
| 39 | 0.34 | 0.36 | 0.41 | 13 | Usable life of 3.0 minutes | Usable life of 2.8 minutes | Usable life of 3.1 minutes |

[In FIG. 14, usable life is caused by the chipping generated in the hard coating layer]

As can be seen apparently from the results shown in Tables 6, 13, and 14, in all the cermet tools 27 to 39 according to the embodiments of the present invention, the heat-transformed α-type (Al, Cr)$_2$O$_3$ layer constituting the upper layer of each hard coating layer has excellent high temperature hardness and heat resistance, and exhibits excellent chipping resistance, thereby showing excellent wear resistance, even in the high-speed intermittent cutting of steel or cast iron with very high mechanical and thermal impacts. However, in all the conventional coated cermet tools 1 to 13, the deposited α-type Al$_2$O$_3$ layers could not resist to severe mechanical and thermal impacts in the high-speed intermittent cutting and thus the chipping is generated in the hard coating layers, thereby shortening the usable life of the conventional cermet cutting tools.

As described above, the coated cermet tool according to the embodiments of the present invention exhibits excellent chipping resistance in the high-speed intermittent cutting under particularly severe cutting conditions, as well as in the continuous cutting or the intermittent cutting of various steels, cast iron, etc. under normal conditions, and has an excellent cutting performance for a long time period, so that it is possible to satisfactorily cope with the demands for high performance of a cutting apparatus, labor saving and energy saving in cutting work, and cost reduction.

What is claimed is:
1. A surface-coated cermet cutting tool comprising:
a hard-coating layer having excellent chipping resistance, wherein the surface-coated cermet cutting tool is formed by coating, on a surface of a tool substrate made of tungsten carbide based cemented carbide or titanium carbonitride based cermet, said hard-coating layer, which comprises a lower layer (a) and an upper layer (b):

(a) as the lower layer, a titanium compound layer comprising at least one or two of a titanium carbide layer, a titanium nitride layer, a titanium carbonitride layer, a titanium carboxide layer and a titanium oxycarbonitride layer, all of which are deposited by chemical vapor deposition, the titanium compound layer having a total average thickness of 3 to 20 μm, and (b) as the upper layer, a heat-transformed α-type Al oxide layer formed by carrying out a heat-transforming treatment in a state that titanium oxide particulates satisfying the composition formula: $TiO_y$, (where value Y is 1.2 to 1.9 in an atomic ratio to Ti when measured by Auger Electron Spectroscopy) and chemically deposited as a transformation starting material are dispersely distributed on a surface of an Al oxide layer having a κ-type or θ-type crystal structure deposited by chemical vapor deposition and satisfying the composition formula: $(Al_{1-X}Zr_X)_2O_3$ (where value X is 0.003 to 0.05 in an atomic ratio when measured by an electron probe micro-analyzer (EPMA)) to thereby transform the crystal structure of the Al oxide layer having the κ-type or θ-type crystal structure into an α-type crystal structure, the heat-transformed α-type Al oxide layer having an average thickness of 1 to 15 μm.

2. A surface-coated cermet cutting tool comprising:

a hard-coating layer having excellent chipping resistance, wherein the surface-coated cermet cutting tool is formed by coating, on a surface of a tool substrate made of tungsten carbide based cemented carbide or titanium carbonitride based cermet, said hard-coating layer, which comprises a lower layer (a) and an upper layer (b):

(a) as the lower layer, a titanium compound layer comprising at least one or two of a titanium carbide layer, a titanium nitride layer, a titanium carbonitride layer, a titanium carboxide layer and a titanium oxycarbonitride layer, all of which are deposited by chemical vapor deposition, the titanium compound layer having a total average thickness of 3 to 20 μm, and (b) as the upper layer, a heat-transformed α-type Al oxide layer formed by carrying out a heat-transforming treatment in a state that titanium oxide particulates satisfying the composition formula: $TiO_y$, (where value Y is 1.2 to 1.9 in an atomic ratio to Ti when measured by Auger Electron Spectroscopy) and chemically deposited as a transformation starting material are dispersely distributed on a surface of an Al oxide layer having a κ-type or θ-type crystal structure deposited by chemical vapor deposition and satisfying the composition formula: $(Al_{1-X}Ti_X)_2O_3$ (where value X is 0.01 to 0.05 in an atomic ratio when measured by an electron probe micro-analyzer (EPMA)) to thereby transform the crystal structure of the Al oxide layer having the κ-type or θ-type crystal structure into an α-type crystal structure, the heat-transformed α-type Al oxide layer having an average thickness of 1 to 15 μm.

3. A surface-coated cermet cutting tool comprising:

a hard-coating layer having excellent chipping resistance, wherein the surface-coated cermet cutting tool is formed by coating, on a surface of a tool substrate made of tungsten carbide based cemented carbide or titanium carbonitride based cermet, said hard-coating layer, which comprises a lower layer (a) and an upper layer (b):

(a) as the lower layer, a titanium compound layer comprising at least one or two of a titanium carbide layer, a titanium nitride layer, a titanium carbonitride layer, a titanium carboxide layer and a titanium oxycarbonitride layer, all of which are deposited by chemical vapor deposition, the titanium compound layer having a total average thickness of 3 to 20 μm, and (b) as the upper layer, a heat-transformed α-type Al oxide layer formed by carrying out a heat-transforming treatment in a state that titanium oxide particulates satisfying the composition formula: $TiO_y$, (where value Y is 1.2 to 1.9 in an atomic ratio to Ti when measured by Auger Electron Spectroscopy) and chemically deposited as a transformation starting material are dispersely distributed on a surface of an Al oxide layer having a κ-type or θ-type crystal structure deposited by chemical vapor deposition and satisfying the composition formula: $(Al_{1-X}Cr_X)_2O_3$ (where value X is 0.005 to 0.04 in an atomic ratio when measured by an electron probe micro-analyzer (EPMA)) to thereby transform the crystal structure of the Al oxide layer having the κ-type or θ-type crystal structure into an α-type crystal structure, the heat-transformed α-type Al oxide layer having an average thickness of 1 to 15 μm.

* * * * *

UNITED STATES PATENT AND TRADEMARK OFFICE
CERTIFICATE OF CORRECTION

PATENT NO.        : 7,273,665 B2                                               Page 1 of 1
APPLICATION NO.   : 11/019656
DATED             : September 25, 2007
INVENTOR(S)       : Takuya Hayahi et al.

It is certified that error appears in the above-identified patent and that said Letters Patent is hereby corrected as shown below:

Title Page item 30

For Foreign Priority Data:

Please insert --3/3/04  (JP)  2004-058686--

Signed and Sealed this

Twenty-seventh Day of November, 2007

JON W. DUDAS
*Director of the United States Patent and Trademark Office*